US011539370B2

(12) United States Patent
Ge

(10) Patent No.: US 11,539,370 B2
(45) Date of Patent: Dec. 27, 2022

(54) ANALOG TO ANALOG QUANTIZER IN CROSSBAR ARRAY CIRCUITS FOR IN-MEMORY COMPUTING

(71) Applicant: TETRAMEM INC., Newark, CA (US)

(72) Inventor: Ning Ge, Newark, CA (US)

(73) Assignee: TetraMem Inc., Fremont, CA (US)

( * ) Notice: Subject to any disclaimer, the term of this patent is extended or adjusted under 35 U.S.C. 154(b) by 326 days.

(21) Appl. No.: 16/798,397

(22) Filed: Feb. 23, 2020

(65) Prior Publication Data

US 2021/0266000 A1 Aug. 26, 2021

(51) Int. Cl.
*H03M 1/22* (2006.01)
*H03M 1/00* (2006.01)
*G11C 13/00* (2006.01)

(52) U.S. Cl.
CPC ......... *H03M 1/001* (2013.01); *G11C 13/0002* (2013.01)

(58) Field of Classification Search
CPC ........ H03M 1/56; H03M 1/001; H03M 1/123; H03M 1/46; H03M 1/68; H03M 1/687; H04N 5/378; H04N 5/357; H04N 5/374; H04N 5/3742; H04N 5/37455; H04N 19/122; H04N 19/42; H04N 19/436; H04N 5/232; H04N 5/23229; H04N 5/2353; H04N 5/341; H04N 5/347; H04N 5/353; H04N 5/3577; H04N 5/3651; H04N 5/3658; H04N 5/369; H04N 5/3698; H04N 5/376; H04N 5/3765; H04N 9/04511
USPC ......................... 341/110, 126, 144, 154, 155
See application file for complete search history.

(56) References Cited

U.S. PATENT DOCUMENTS

| | | | | |
|---|---|---|---|---|
| 7,414,561 | B1 * | 8/2008 | Brubaker | H03M 1/0682 341/145 |
| 10,872,929 | B2 * | 12/2020 | Yan | H01L 51/5265 |
| 11,114,158 | B1 * | 9/2021 | Ge | G11C 11/1673 |
| 2010/0033362 | A1 * | 2/2010 | Kitami | H04N 5/347 341/169 |
| 2015/0347896 | A1 * | 12/2015 | Roy | H03K 3/356104 706/29 |
| 2017/0228345 | A1 * | 8/2017 | Gupta | G06F 17/141 |
| 2018/0083648 | A1 * | 3/2018 | Cagdaser | H03M 1/747 |
| 2019/0205741 | A1 * | 7/2019 | Gupta | G06F 9/3877 |
| 2019/0369873 | A1 * | 12/2019 | Liu | G06N 3/08 |
| 2020/0053299 | A1 * | 2/2020 | Zhang | H04N 5/23229 |
| 2021/0149984 | A1 * | 5/2021 | Luo | G11C 7/1006 |
| 2021/0306585 | A1 * | 9/2021 | Nakagawa | H04N 5/378 |
| 2021/0390382 | A1 * | 12/2021 | Kwon | H03M 1/12 |

* cited by examiner

*Primary Examiner* — Linh V Nguyen
(74) *Attorney, Agent, or Firm* — Jaffery Watson Mendonsa & Hamilton LLP

(57) ABSTRACT

Technologies relating to analog-to-analog quantizers with an intrinsic Rectified Linear Unit (ReLU) function designed for in-memory computing are disclosed. An apparatus, in some implementations, includes: a DAC; a first crossbar connected to the DAC; a first analog quantizer connected to the first crossbar; a buffer connected to the first analog quantizer; a second crossbar connected to the buffer; and an ADC connected to the second crossbar.

14 Claims, 7 Drawing Sheets

5000

| | Comparators | CMOS Gates | Voutput |
|---|---|---|---|
| Vin > Vref | 1, 1, 1, 1 | On, Off, Off, Off | Vref |
| ¾ Vref < Vin < Vref | 0, 1, 1, 1 | Off, On, Off, Off | ¾ Vref |
| ½ Vref < Vin < ¾ Vref | 0, 0, 1, 1 | Off, Off, On, Off | ½ Vref |
| ¼ Vref < Vin < ½ Vref | 0, 0, 0, 1 | Off. Off. Off. On | ¼ Vref |
| Vin < ¼ Vref | 0, 0, 0, 0 | Off, Off, Off, Off | 0 |

FIG. 5

ANALOG TO ANALOG QUANTIZER IN CROSSBAR ARRAY CIRCUITS FOR IN-MEMORY COMPUTING

TECHNICAL FIELD

The present disclosure relates generally to crossbar array circuits for in-memory computing and more specifically to analog-to-analog quantizers with an intrinsic Rectified Linear Unit (ReLU) function designed for in-memory computing.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

An RRAM is a two-terminal passive device capable of changing resistance responsive to sufficient electrical stimulations, which have attracted significant attention due to its applications in high-performance non-volatile memories. The resistance of an RRAM may be electrically switched between two states: a High-Resistance State (HRS) and a Low-Resistance State (LRS). The switching event from an FIRS to an LRS is often referred to as a "Set" or "On" switch; the switching event from an LRS to an HRS is often referred to as a "Reset" or "Off" switching process.

A Digital-to-Analog Converter (DAC) is a device that converts digital signals into analog signals; an Analog to Digital Converter (ADC) is a device that converts analog signals into digital signals. Generally, a crossbar array circuit received analog signals. Therefore, ADCs and DACs are used as the interfaces between crossbars and digital circuits ahead or afterward.

In addition to DAC and ADC, other analog-digital conversion devices, such as a pulse number modulation device and a pulse frequency modulation device, may also be used to connect digital devices with analog devices. These device often include one or more integrate-and-fire circuits for converting analog signals to and from the number or the frequency of pulses.

Analog signals, however, may not be directly transmitted between crossbar array circuits: errors or noises inherently exist in crossbar array circuits or introduced into the crossbar array circuits from external environment may accumulated and become amplified during circuit operations and thus affect the transmission of analog signals. Conventionally, therefore, one or more ADCs or DACs are needed for transmitting signals between different crossbar array circuits. These additional ADCs and DACs, however, increase both power consumption and circuit complexity.

Further, a generic activation function may be provided for different types of neural network applications implemented using crossbar array circuits; the cost of training an activation function is thus reduced.

SUMMARY

Technologies relating to analog-to-analog quantizers with an intrinsic Rectified Linear Unit (ReLU) function designed for in-memory computing are disclosed.

An apparatus, in some implementations, includes: a DAC; a first crossbar connected to the DAC; a first analog quantizer connected to the first crossbar; a buffer connected to the first analog quantizer; a second crossbar connected to the buffer; and an ADC connected to the second crossbar.

In some implementations, the first crossbar includes a word line, a bit line, and a cross-point device formed between the word line and the bit line.

In some implementations, the cross-point device includes an RRAM device.

In some implementations, the first crossbar is configured to perform in-memory computation.

In some implementations, the buffer includes a unity gain amplifier.

In some implementations, the first analog quantizer includes: a voltage divider set; a comparator set having multiple comparators configured to generate voltage comparisons; and a logic set, wherein the voltage divider is configured to divide a reference voltage into multiple divided reference voltages, each divided reference voltage is configured to establish a respective reference voltage for each comparator of the comparator set, and a voltage potential difference between adjacent divided reference voltages is substantially equal throughout the voltage divider set.

In some implementations, the logic set is configured to output one of the respective reference voltages to the buffer based on the voltage comparisons.

In some implementations, the logic set includes one or more CMOS gates, one or more NOT gates, and one or more AND gates, each of the respective reference voltages connected to each of the CMOS gates.

In some implementations, the voltage divider includes multiple resistances serially connected between the reference voltage and a ground potential.

In some implementations, the first analog quantizer has a ReLU function.

In some implementations, the comparator set is configured to generate digital values from outputs of each comparator to the logic set, the digital values are based on the voltage comparisons between an input voltage, and the respective reference voltages for each comparator.

An apparatus, in some implementations, includes: a first DAC; a first crossbar connected to the first DAC; a first analog quantizer connected to the first crossbar; a second DAC; a second crossbar connected to the second DAC; a second analog quantizer connected to the second crossbar; a buffer connected to the first analog quantizer and the second analog quantizer; a third crossbar connected to the buffer; and an ADC connected to the third crossbar.

In some implementations, the buffer includes a non-inverting summing amplifier.

In some implementations, the buffer includes a differential amplifier.

In some implementations, the first crossbar, the second crossbar, and the third crossbar are configured to perform in-memory computation.

BRIEF DESCRIPTION OF THE DRAWINGS

FIG. 5 is a table illustrating digital values of several comparators, ON/OFF statues of several CMOS gates, and output signals, responsive to different input signals.

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to analog-to-analog quantizers with an ReLU function designed for in-memory computing are disclosed. The technologies described in the present disclosure may provide the following technical advantages.

First, the disclosed technologies use an analog-to-analog quantizer, in place of a conventional ADC, to enable communicate between crossbar array circuits. These designs reduce circuit complexity and device overhead, especially in large-scale circuits. In some implementations, a crossbar circuit needs only one DAC at the input end and one ADC at the output end. Adjacent crossbar array circuits may be connected using analog quantizers with buffers to provide analog quantized signals without additional ADCs and DACs. This is especially important for applications that require a large number of crossbar array circuits, such as AI computing, in-memory computing, and neuromorphic computing.

Second, in neural network applications, a ReLU function is needed to generate and transmit signal from one crossbar array circuit to the next crossbar array circuit (e.g., from one layer of a neural network to the next layer of the neural network). By using analog-to-analog quantizers with buffers, a ReLU function is intrinsically implemented without additional hardware, because a voltage is set and bounded between Vref and Gnd.

Finally, an additional summing amplifier or differential amplifier may be implemented to calculate (e.g., add or subtract) outputs from two crossbar array circuits and then transmit the calculated output to a third crossbar array circuit. These technologies provide greater capabilities for performing in-memory computing, analog computing, and neural network.

Figure 1:
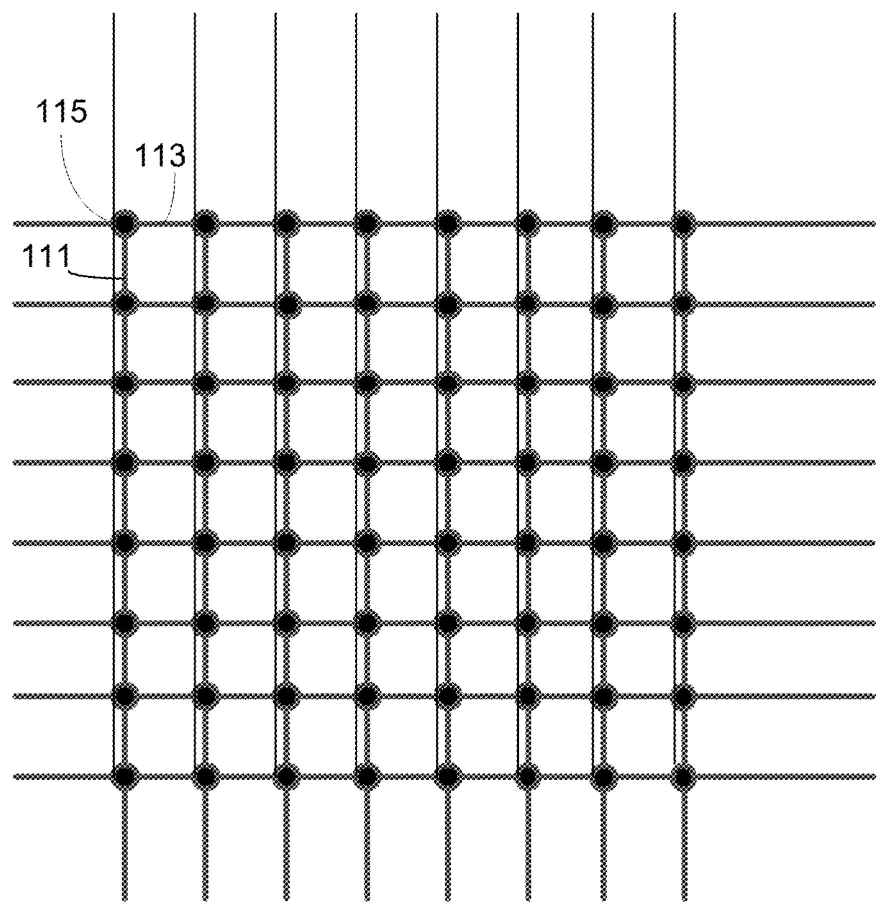
FIG. 1 is a block diagram illustrating an example crossbar array circuit in accordance with some implementations of the present disclosure.

FIG. 1 is a block diagram 1000 illustrating an example crossbar array circuit 101 in accordance with some implementations of the present disclosure.

As shown in FIG. 1, the crossbar array circuit 101 includes one or more of bit lines (e.g., a bit line 111), one or more word lines (e.g., a word line 113), and one or more cross-point devices (e.g., a 1T1R cell 115) connected between the bit lines and the word lines. The crossbar array circuit 101 may be implemented to perform in-memory computations and may therefore be also referred to as an In-Memory Computing crossbar (IMC crossbar).

In some implementations, the cross-point device 115 may be one of: a memristor, a memristive device, a Pulse-Code Modulation (PCM) device, a floating date, a phase change device, a Resistive Random-Access Memory (RRAM or ReRAM), a Magnetoresistive Random-Access Memory (MRAM), a Dynamic random-access memory (DRAM), a Static Random-Access Memory (static RAM or SRAM), or other devices with a tunable resistance.

In some implementations, the cross-point device 115 may be have 1-Transistor-1-Resistor (1T1R) structure, 1-Selector-1-Resistor (1S1R) structure, or 2-Resistor (2R) structure.

Figure 2:
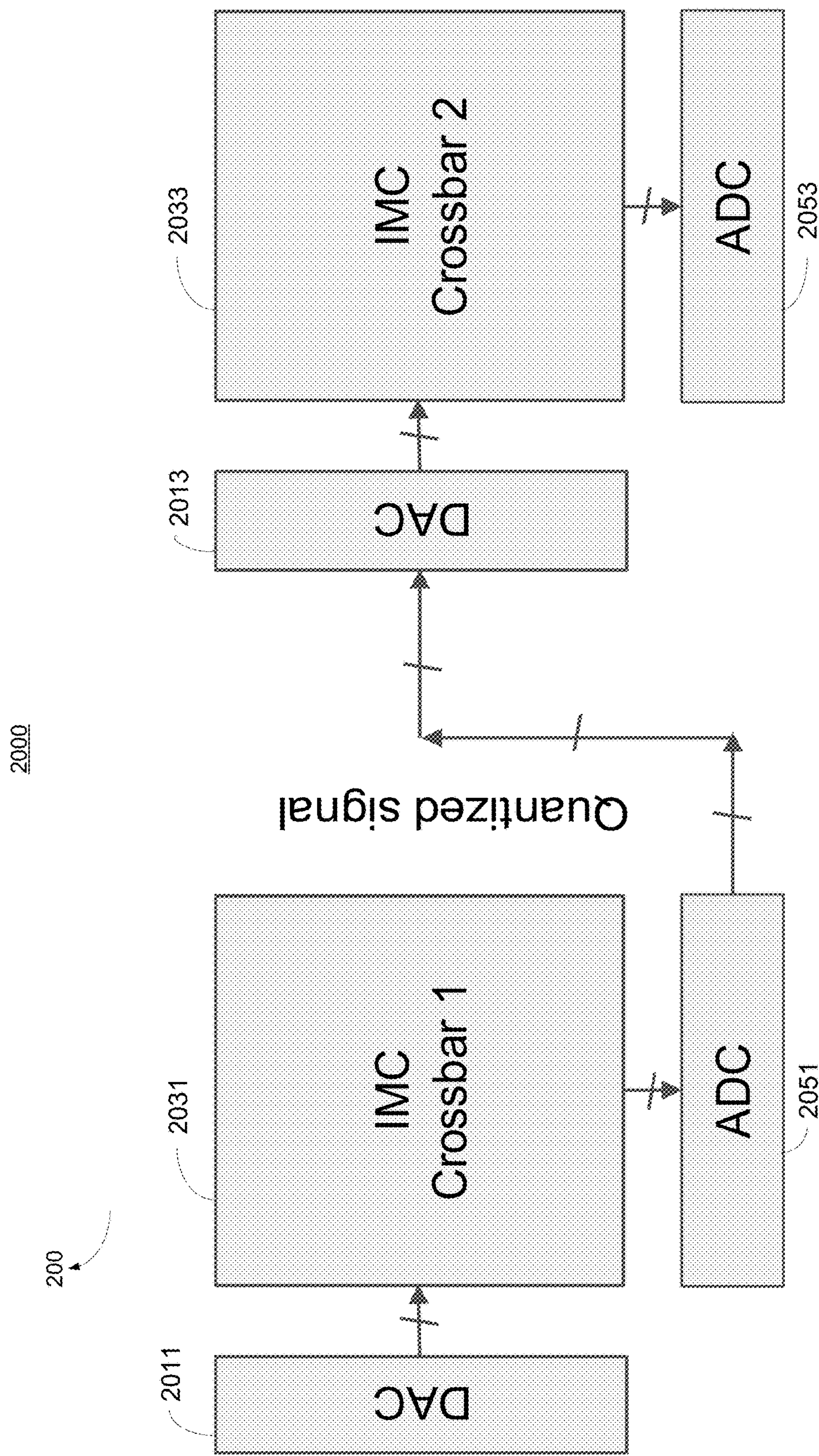
FIG. 2 is a block diagram illustrating a first example IMC crossbar circuit in accordance with some implementations of the present disclosure.

FIG. 2 is a block diagram 2000 illustrating a first example IMC crossbar circuit 200 in accordance with some implementations of the present disclosure. In some implementations, the IMC crossbar circuit 200 may be a conventional crossbar circuit 200.

The IMC crossbar circuit 200 may include a second ADC 2051 and a second DAC 2013 connected between a first IMC crossbar 2031 and a second IMC crossbar 2033 to transmit signals from the crossbar 2031 to the crossbar 2033. A conventional ADC may quantize analog signals and reduce errors and noises. The circuit overhead may be high, however, if IMC crossbar circuit 200 includes a large number of IMC crossbars, which may be needed for neural network applications. Thus, circuits with less complexity and devices are technically advantageous.

Figure 3:
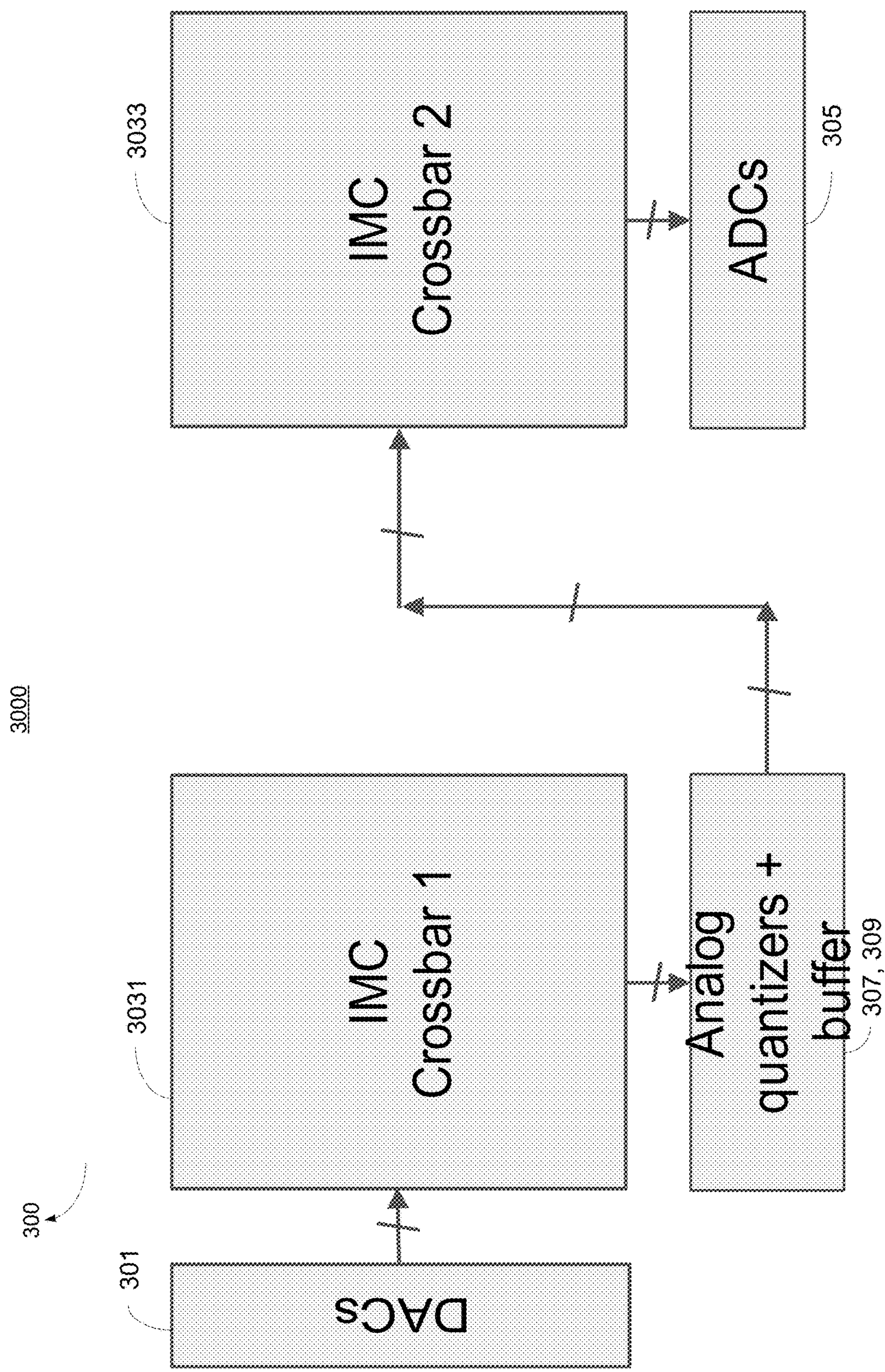
FIG. 3 is a block diagram illustrating a second example IMC crossbar circuit in accordance with some implementations of the present disclosure.

FIG. 3 is a block diagram 3000 illustrating a second example IMC crossbar circuit 300 in accordance with some implementations of the present disclosure.

The IMC crossbar circuit 300 shown in FIG. 3 may include one or more DACs 301, a first IMC crossbar 3031 connected to a DAC 301, an analog quantizer 307 connected to the first IMC crossbar 3031, a buffer 309 connected to the analog quantizer 307, a second IMC crossbar 3033 connected to the buffer 309, and one or more ADC 305 connected to the second IMC crossbar 3033.

The DAC 301 may convert a digital input signal into an analog input signal. The analog input signal may then be computed or programmed via the first IMC crossbar 3031 to produce an analog signal. The analog quantizer 307 may then quantize the analog signal into a quantized analog signal and transmit the quantized analog signal to the buffer 309. The buffer 309 may convert the quantized analog signal into a quantized current signal and transmit the quantized current signal to the second IMC crossbar 3033. The ADC 305 may then convert an analog signal produced by the second IMC crossbar 3033 into a digital signal.

In some implementations, the analog quantizer 307 is configured to convert an analog signal into a quantized voltage signal. It is noted that a quantized voltage signal may be represented by several voltage intervals set in advance. In some implementations, a voltage resolution of the quantizer is equal to its overall voltage measurement range divided by the number of intervals. In some implementations, the buffer 309 is configured to convert a quantized voltage signal into a quantized current signal.

Figure 4:
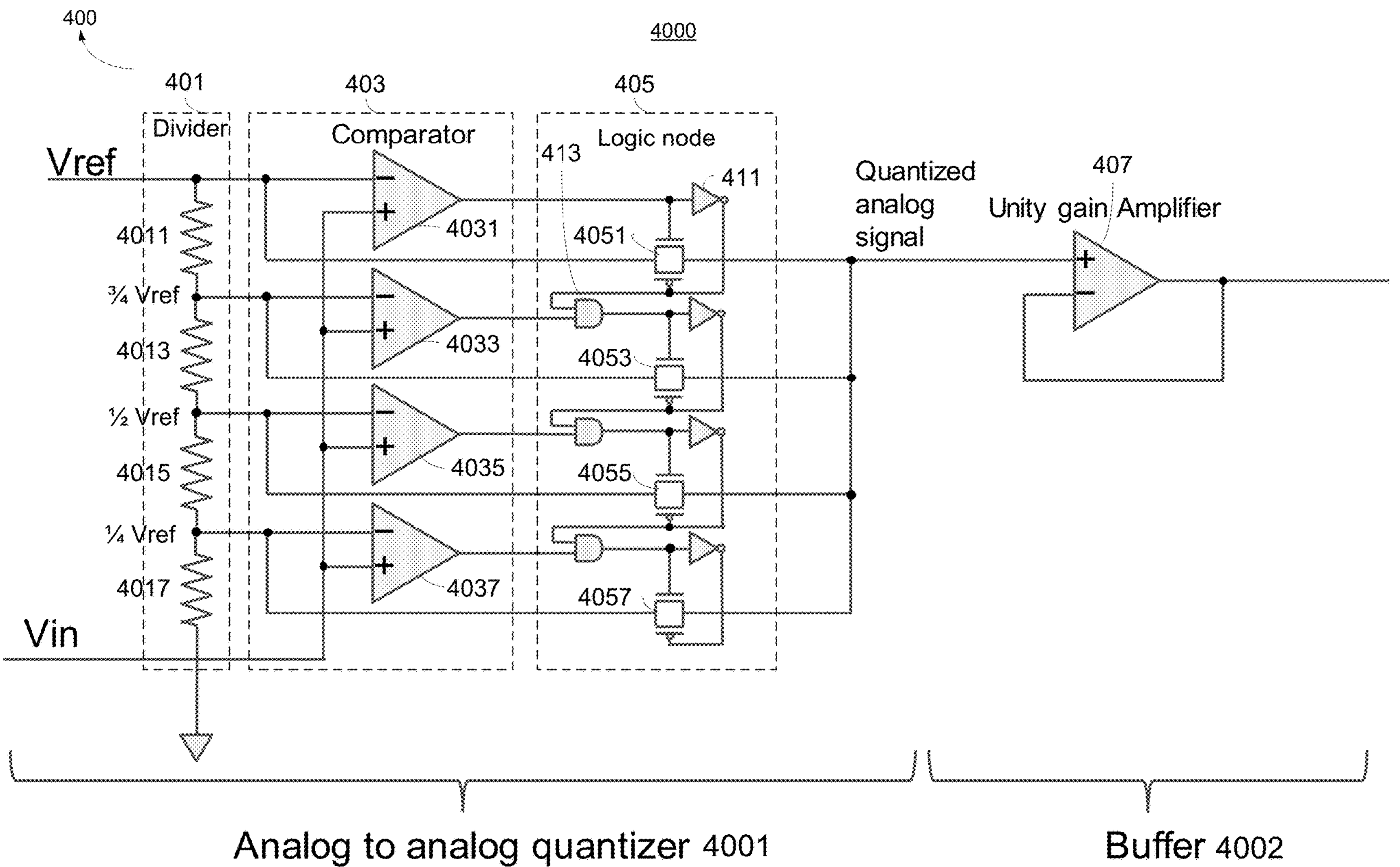
FIG. 4 is a block diagram illustrating an example circuit equipped with an analog to analog quantizer and a buffer in accordance with some implementations of the present disclosure.

FIG. 4 is a block diagram 4000 illustrating an example circuit 400 equipped with an analog to analog quantizer 4001 and a buffer 4002 in accordance with some implementations of the present disclosure. The analog quantizer 4001 and the buffer 4002 shown in FIG. 4 may be the quantizer 307 and the buffer 309 shown in FIG. 3, respectively.

As shown in FIG. 4, the analog-to-analog quantizer 4001 includes a group 401 of voltage dividers, a group 403 of comparators, and a group 405 of logic nodes.

The group 401 of voltage dividers may include two or more resistances (e.g., resistances 4011, 4013, 4015, and 4017) serially connected with each other and between a reference voltage ($V_{ref}$) and a ground (GND), dividing the $V_{ref}$ into two or more divided reference voltages. Each divided reference voltage is configured to establish a respective reference voltage for each comparator in the group 403 of comparators. Voltage potential differences between adjacent reference voltages are substantially the same within the group 401 of voltage dividers. For instance, the group 401 of voltage dividers may divide the $V_{ref}$ into four divided reference voltages: $V_{ref}$, ¾ $V_{ref}$, ½ $V_{ref}$, and ¼ $V_{ref}$.

The group 403 of comparators includes two or more comparators (e.g., comparator 4031, 4033, 4035, and 4037). The group 403 of comparators is configured to generate a digital value $V_{in}$ from an output of a comparator an transmit the generated digital value $V_{in}$ to the group 405 of logic nodes. The digital value is generated in accordance with a comparison between the input signal $V_{in}$, and a respective reference voltage for a respective comparator: $V_{ref}$, ¾ $V_{ref}$, ½ $V_{ref}$, and ¼ $V_{ref}$.

The group 405 of logic nodes is configured to output one of the respective reference voltages ($V_{ref}$, ¾ $V_{ref}$, ½ $V_{ref}$, and ¼ $V_{ref}$) in accordance with a comparison result. The group 405 of logic nodes may be configured to output only one of the respective reference voltages at a time.

In some implementations, the group 405 of logic nodes includes CMOS gates 4051, 4053, 4055, and 4057. The CMOS gates 4051, 4053, 4055, and 4057 are configured to determine which one of the respective reference voltages may pass through. The group 405 of logic nodes may also include one or more of NOT gates (e.g., a first NOT gate 411), and one or more AND gates (e.g., a first AND gate 413).

The circuit 400 may further include the buffer 4002. The buffer 4002 may convert a voltage signal into a current signal, which may be used to program another IMC crossbar within the circuit 400. In some implementations, the buffer 4002 includes a unity gain amplifier 407. In some implementations, the buffer 4002 includes one or more amplifiers other than a unity gain amplifier to achieve different functionalities and performance goals.

FIG. 5 is a table 5000 illustrating digital values of several comparators, ON/OFF statues of several CMOS gates, and output signals, responsive to different input signals.

As shown in FIG. 5, when the voltage range of an input signal $V_{in}$ is higher than $V_{ref}$, the group 403 of comparators may generate the following digital values: 1, 1, 1, and 1. As a result, only the first CMOS gates 4051 may be turned on. In accordance with the set of digital values (1, 1, 1, and 1), the group 405 of logic nodes selects the reference voltage $V_{ref}$ from the group of reference voltages ($V_{ref}$, ¾ $V_{ref}$, ½ $V_{ref}$, and ¼ $V_{ref}$) for output. In accordance with the reference voltage $V_{ref}$ being the output voltage, the quantizer 4001 quantizes the input signal $V_{in}$, as $V_{ref}$.

Therefore, using the group 401 of voltage dividers, the group 403 of comparators, and the group 405 of logic nodes, the quantizer 4001 may quantize an input signal as a quantized voltage signal. The quantized signal may reduce noise or error in a crossbar circuit, because the input signal has now been quantized as a fixed value within one of the predetermined voltage ranges. Furthermore, because the voltage range of the quantizer 4001 is set between the voltage $V_{ref}$ and the Ground GND, the quantized voltage is bounded between the voltage $V_{ref}$ and the Ground GND, providing a ReLU function.

Figure 6:
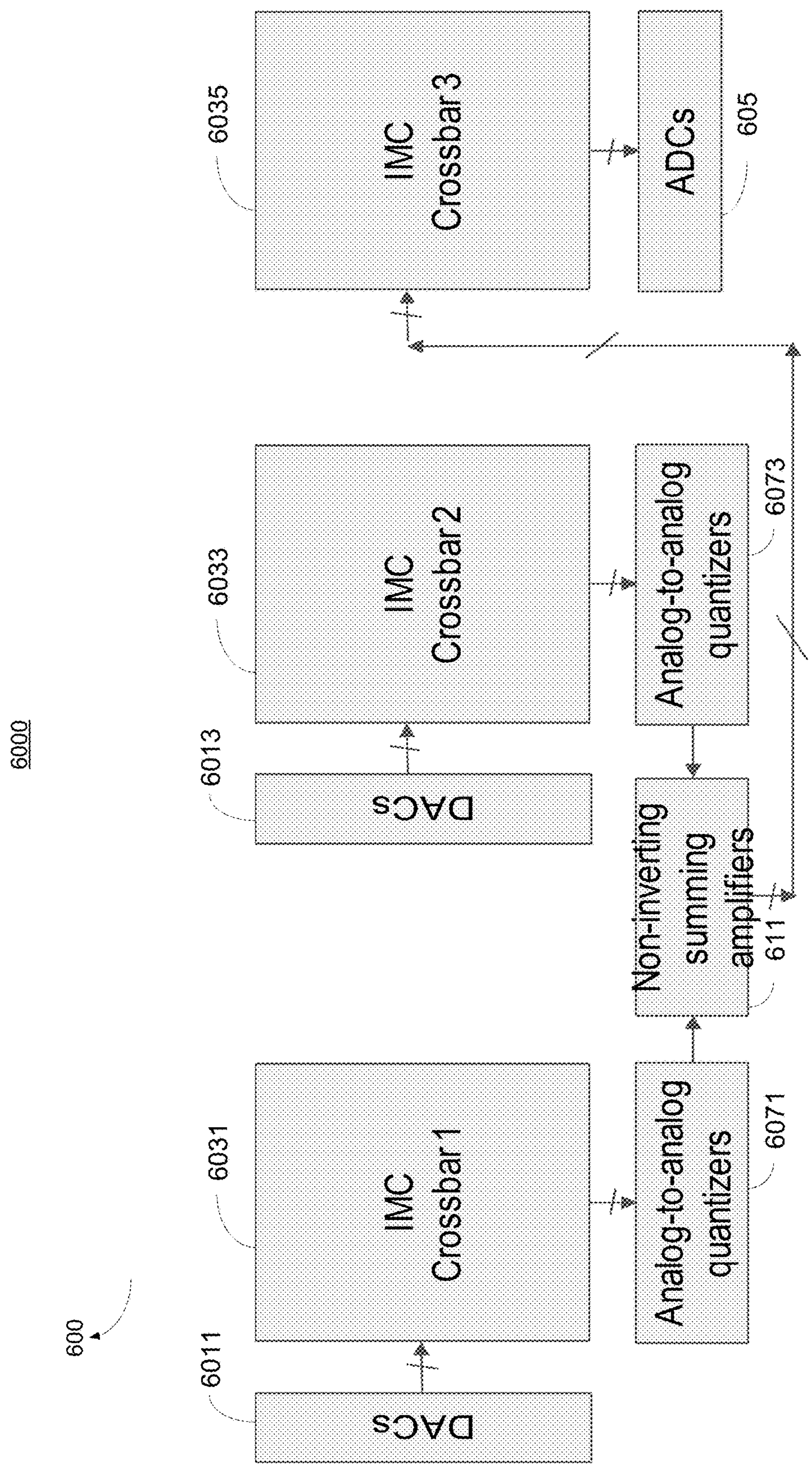
FIG. 6 is a block diagram illustrating an example IMC crossbar circuit in accordance with some implementations of the present disclosure.

FIG. 6 is a block diagram 6000 illustrating an example IMC crossbar circuit 600 in accordance with some implementations of the present disclosure.

As shown in FIG. 6, the IMC crossbar circuit 600 may include a first DAC 6011, a first IMC crossbar 6031 connected to the first DAC 6011, a first analog quantizer 6071 connected to the first IMC crossbar 6031, a second DAC

6013, a second IMC crossbar 6033 connected to the second DAC 6013, a second quantizer 6073 connected to the second IMC crossbar 6033, a buffer (which may include a non-inverting summing amplifier 611 connected to both the first analog quantizer 6071 and the second analog quantizer 6073), a third IMC crossbar 6035 connected to the non-inverting summing amplifier 611, and a ADC 605 connected to the third IMC crossbar 6035.

When two digital input signals are provided to the first DAC 6011 and the second DAC 6013, the DACs 6011 and 6013 may convert the two digital input signals into two analog input signals. The two analog input signals may then be computed or programmed via the first IMC crossbar 6031 and the second IMC crossbar 6033, to produce two analog signals.

The analog quantizers 6071 and 6073 may quantize the two analog signals into two quantized analog signals and transmit the two quantized analog signals to the non-inverting summing amplifier 611. The non-inverting summing amplifier 611 may combine the two quantized analog signals into a combined analog signal, convert the combined analog signal into a combined current signal, and transmit the combined current signal to the third IMC crossbar 6035. The third IMC crossbar 6035 may produce an analog signal based on the combined current signal generated by the non-inverting summing amplifier 611. The ADC 605 may convert the analog signal outputted by the third IMC crossbar 6035 into a digital signal.

Figure 7:
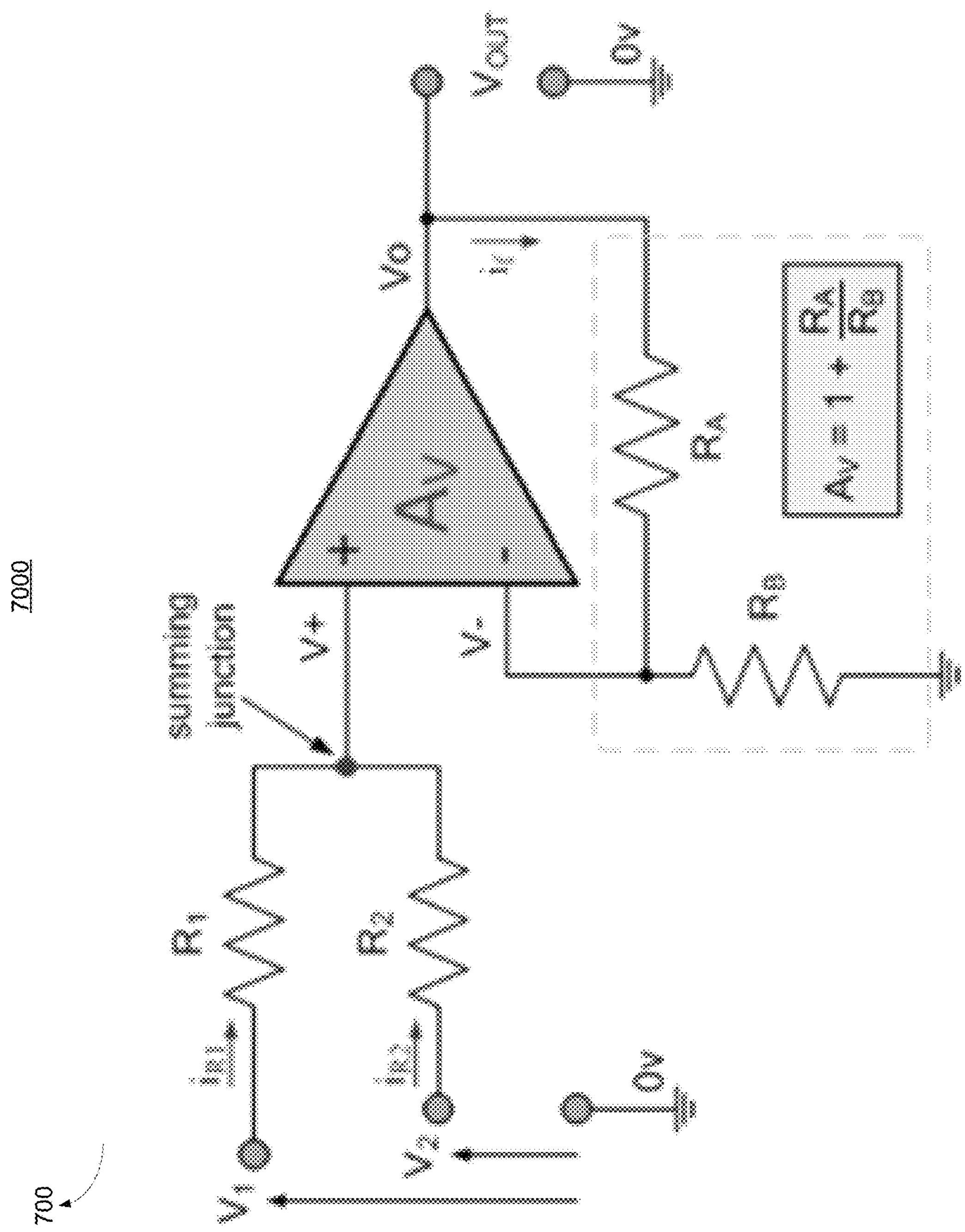
FIG. 7 is a block diagram illustrating an example non-inverting summing amplifier in accordance with some implementations of the present disclosure.

FIG. 7 is a block diagram 7000 illustrating an example non-inverting summing amplifier 700 in accordance with some implementations of the present disclosure.

A buffer within a crossbar circuit (for example, the buffer 309 discussed with reference to FIG. 3 and the buffer 4002 discussed with reference to FIG. 4) may be implemented using the non-inverting summing amplifier 700. The buffer may include a differential amplifier or other types of amplifiers. The buffer may provide a computing function for quantized signals, which is highly desirable feature in in-memory computing applications, analog computing applications, and neural network applications.

Technologies disclosed in the present disclosure may reduce the need and thus the cost for including additional ADCs and DACs in an IMC crossbar. Therefore, the cost for implementing Deep Neural Networks (DNN) or similar applications that require a large number of IMC crossbars is also reduced. As explained in the present disclosure, in some implementations, providing one ADC at the input end of a circuit and one DAC at the output end of the circuit suffices.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:

a digital-to-analog converter (DAC);

a first crossbar connected to the DAC;

a first analog quantizer connected to the first crossbar, wherein the first analog quantizer comprises:

a voltage divider set;

a comparator set having multiple comparators configured to generate voltage comparisons; and a logic set, wherein the voltage divider is configured to divide a reference voltage into multiple divided reference voltages, wherein each divided reference voltage is configured to establish a respective reference voltage for each comparator of the comparator set, and wherein a voltage potential difference between adjacent divided reference voltages is substantially equal throughout the voltage divider set;

a buffer connected to the first analog quantizer;

a second crossbar connected to the buffer; and an analog-to-digital converter (ADC) connected to the second crossbar.

2. The apparatus as claimed in claim 1, wherein the first crossbar comprises a word line, a bit line, and a cross-point device formed between the word line and the bit line.

3. The apparatus as claimed in claim 2, wherein the cross-point device comprises an RRAM (resistive random-access memory) device.

4. The apparatus as claimed in claim 1, wherein the first crossbar is configured to perform in-memory computation.

5. The apparatus as claimed in claim 1, wherein the buffer comprises a unity gain amplifier.

6. The apparatus as claimed in claim 1, wherein the logic set is configured to output one of the respective reference voltages to the buffer based on the voltage comparisons.

7. The apparatus as claimed in claim 6, wherein the logic set comprises one or more CMOS gates, one or more NOT gates, and one or more AND gates, each of the respective reference voltages connected to each of the CMOS gates.

8. The apparatus as claimed in claim 1, wherein the voltage divider comprises multiple resistances serially connected between the reference voltage and a ground potential.

9. The apparatus as claimed in claim 1, wherein the first analog quantizer has an intrinsic Rectified Linear Unit (ReLU) function.

10. The apparatus as claimed in claim 1, wherein the comparator set is configured to generate digital values from outputs of each comparator to the logic set, the digital values are based on the voltage comparisons between an input voltage, and the respective reference voltages for each comparator.

11. An apparatus comprising:

a first digital-to-analog converter (DAC);

a first crossbar connected to the first DAC;

a first analog quantizer connected to the first crossbar;

a second digital-to-analog converter (DAC);

a second crossbar connected to the second DAC;

a second analog quantizer connected to the second crossbar;

a buffer connected to the first analog quantizer and the second analog quantizer; and a third crossbar connected to the buffer; and an analog-to-digital converter (ADC) connected to the third crossbar.

12. The apparatus as claimed in claim 11, wherein the buffer comprises a non-inverting summing amplifier.

13. The apparatus as claimed in claim 11, wherein the buffer comprises a differential amplifier.

14. The apparatus as claimed in claim 11, wherein the first crossbar, the second crossbar, and the third crossbar are configured to perform in-memory computation.

* * * * *